United States Patent
Kujala

(10) Patent No.: US 9,374,066 B2
(45) Date of Patent: Jun. 21, 2016

(54) RESISTANCE MULTIPLIER

(71) Applicant: Fairchild Semiconductor Corporation, San Jose, CA (US)

(72) Inventor: Juha-Matti Kujala, Kokkola (FI)

(73) Assignee: FAIRCHILD SEMICONDUCTOR CORPORATION, San Jose, CA (US)

( * ) Notice: Subject to any disclaimer, the term of this patent is extended or adjusted under 35 U.S.C. 154(b) by 0 days.

(21) Appl. No.: 14/524,505

(22) Filed: Oct. 27, 2014

(65) Prior Publication Data

US 2015/0116038 A1     Apr. 30, 2015

Related U.S. Application Data

(60) Provisional application No. 61/895,955, filed on Oct. 25, 2013.

(51) Int. Cl.
*H03L 5/00*     (2006.01)
*H03H 11/40*     (2006.01)

(52) U.S. Cl.
CPC ................... *H03H 11/405* (2013.01)

(58) Field of Classification Search
CPC .................... H03L 5/00; H03F 1/56
USPC .......... 327/306, 308, 552; 333/81 R
See application file for complete search history.

(56) References Cited

U.S. PATENT DOCUMENTS 8,624,659 B2 *     1/2014     Nadimpalli et al. .......... 327/356

* cited by examiner

*Primary Examiner* — Dinh T Le
(74) *Attorney, Agent, or Firm* — Schwegman Lundberg & Woessner, P.A.

(57) ABSTRACT

This document discusses, among other things, a resistance multiplier configured to provide a more specific and controllable resistance value, the resistance multiplier including an amplifier configured to control a resistance across a first transistor using a received reference resistance value and to control a resistance across a second transistor using the resistance across the first transistor and a relationship between the first and second transistors.

20 Claims, 3 Drawing Sheets

RESISTANCE MULTIPLIER

CLAIM OF PRIORITY

This application claims the benefit of priority under 35 U.S.C. §119(e) of U.S. Provisional Patent Application Ser. No. 61/895,955, titled "RESISTANCE MULTIPLIER," filed on Oct. 25, 2013, which is incorporated by reference herein in its entirety.

BACKGROUND

Various electronic circuits require large resistance values. For example, many low-dropout regulator (LDO) circuits include an internal reference filter with a large continuous-time time constant to reduce the 1/f noise of an associated internal reference voltage source. These large continuous-time time constants can require very large resistance values (e.g., 500 MΩ to 5 GΩ, etc.).

FIG. 1 illustrates generally an existing resistor-capacitor (RC) circuit 100 including a filter resistor ($R_{FILT}$) composed of first, second, third, and fourth resistors 111, 112, 113, 114, each having a unit value ($R_{UNIT}$), and a filter capacitor ($C_{FILT}$) 120. However, if the filter resistor is a standard high-ohmic poly resistor, it would require a large amount of area on silicon. Accordingly, there is a need to provide large resistance values using a smaller area than traditional resistors.

FIG. 2 illustrates generally an example active resistor solution 500, including first and second PMOS transistors 150, 160, a bias current 155, a capacitor 165, an input (IN), and an output (OUT). The first and second PMOS transistors 150, 160 are configured as a PMOS current mirror with the bias current 155. The gate of the first PMOS transistor 150 is coupled to the drain, such that the first PMOS transistor 150 is connected as a diode. The drop from the source of the first PMOS transistor 150 to the gate of the first PMOS transistor 150 provides a constant gate-to-source voltage ($V_{GS}$) for the second PMOS transistor 160 to enable the second PMOS transistor 160 to provide a near constant resistance between the input and the output across a wide range of positive input values. However, the resistance of the active resistor solution 500 is entirely dependent on the voltage drop across the first PMOS transistor 150 and the electrical characteristics of the second PMOS transistor 160 at that gate-to-source voltage ($V_{GS}$). Accordingly, it can be difficult to easily provide a specific or controllable resistance value.

OVERVIEW

This document discusses, among other things, a resistance multiplier configured to provide a more specific and controllable resistance value, the resistance multiplier including an amplifier configured to control a resistance across a first transistor using a received reference resistance value and to control a resistance across a second transistor using the resistance across the first transistor and a relationship between the first and second transistors.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventor has recognized, among other things, a resistance multiplier solution configured to provide a more specific and controllable resistance value than previous examples.

Figure 3:
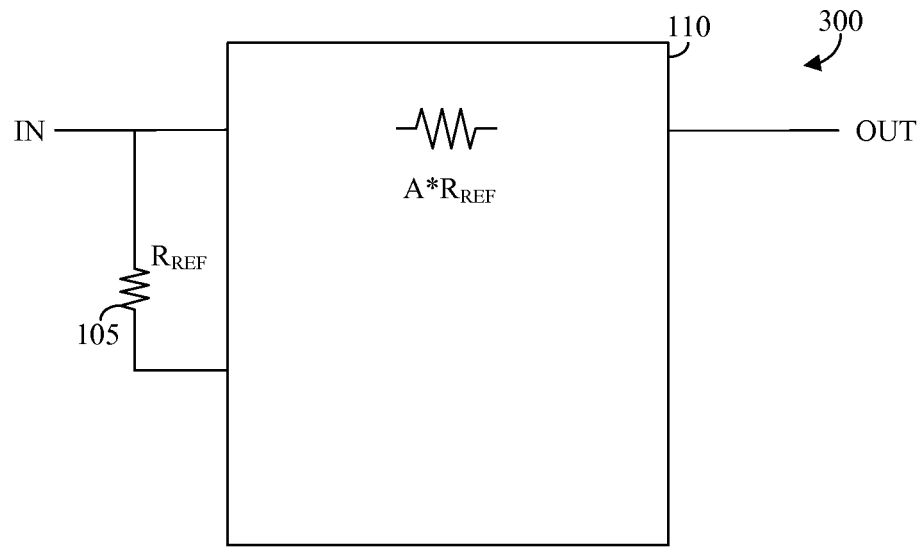
FIGS. 3-5 illustrate generally example resistance multiplier systems.

FIG. 3 illustrates generally an example resistance multiplier system 300 including a reference resistor ($R_{REF}$) 105, a resistance multiplier 110, an input (IN), and an output (OUT). In an example, the resistance multiplier system 300 can be configured to provide a resistance value greater than, but proportional to, the reference resistor 105, e.g., $A \cdot R_{REF}$, where A is a desired multiplication factor. Whereas the active resistor solution of FIG. 5 can provide a large resistance with a small area on silicon, the resistance multiplier system 100 can provide a specific and controllable resistance value dependent on a single reference resistor 105 and the desired multiplication factor A.

Figure 4:
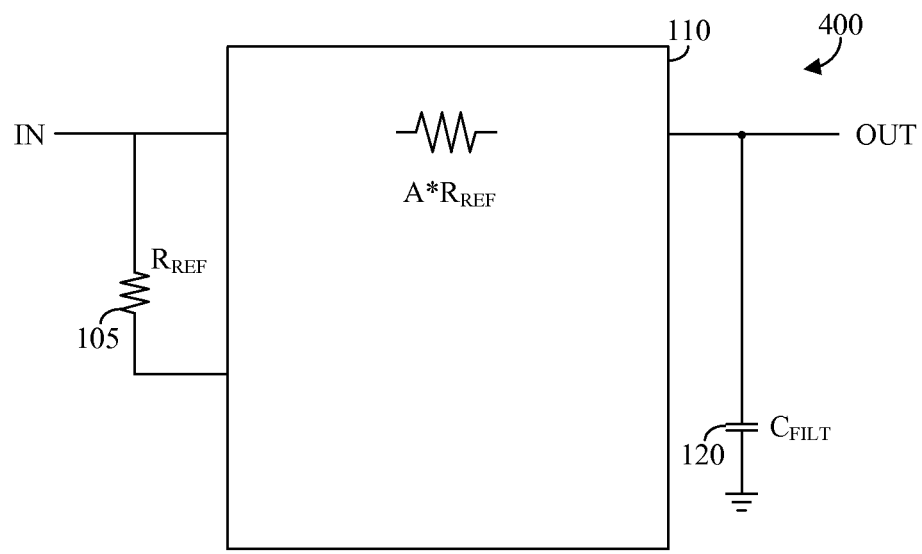

FIG. 4 illustrates generally an example resistance multiplier system 400 including a reference resistor ($R_{REF}$) 105, a resistance multiplier 110, an input (IN), and output (OUT), and a filter capacitor ($C_{FILT}$) 120.

Figure 5:
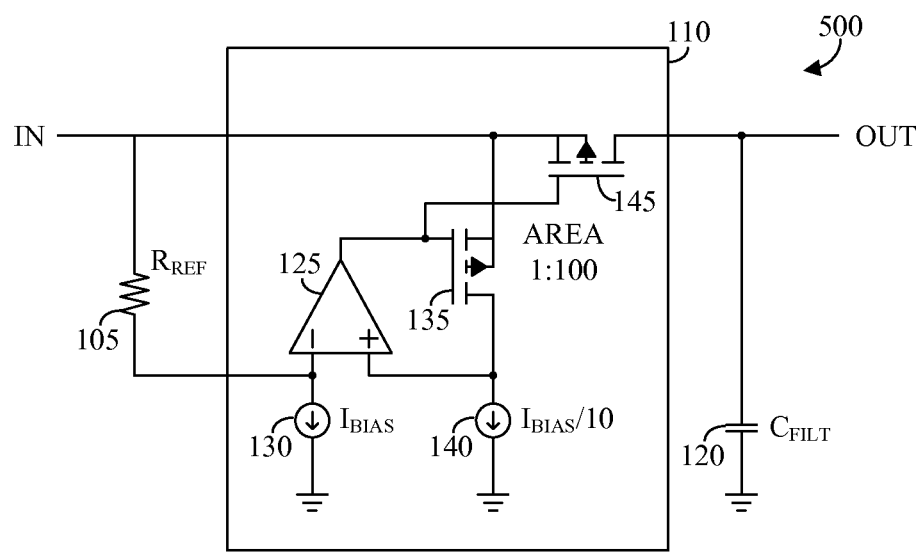

FIG. 5 illustrates generally an example resistance multiplier system 500 including a reference resistor ($R_{REF}$) 105, a resistance multiplier 110, an input (IN), an output (OUT), and a filter capacitor ($C_{FILT}$) 120. In an example, the resistance multiplier 110 includes an amplifier 125 having positive and negative inputs and an output, a first bias current source 130, a first transistor 135, a second bias current 140, and a second transistor 145.

In an example, the reference resistor 105 can include a reference poly resistor. The resistance of the resistance multiplier 110 is defined by the value of the reference resistor 105 and the desired multiplication factor A (e.g., $1000 \cdot R_{REF}$, etc.).

The first transistor 135 has a controlled resistance, set by the value of the reference resistor 105 and the ratio of the first and second bias current sources 130, 140. In the example of FIG. 5, the second current source 140 provides 1/10 the current of the first current source 130. In other examples, one or more other values or ratios can be provided. The output of the amplifier 125 drives the gate of the first transistor 135 until the positive and negative inputs of the amplifier 125 are equal. In this example, for the positive and negative inputs of the amplifier 125 to be equal, the controlled resistance of the first transistor 135 would be a factor of 10 larger than the value of the reference resistor 105. Because the output of the amplifier 125 is also coupled to the gate of the second transistor, the resistance across the second transistor 145 corresponds to the resistance across of the first transistor 135, dependent on the difference in area of the first and second transistors 135, 145. Here, the area (e.g., channel width) of the second transistor to the first transistor 135 is 100:1. Accordingly, the resistance across the second transistor 145 is a factor of 1000 (10·100) times the value of the reference resistor 105. In other examples, one or more other ratios of area between the first and second transistors 135, 145 can be used, and the resulting resistance of the resistance multiplier 110 with respect to the reference resistor 105 will change accordingly.

Figure 1:
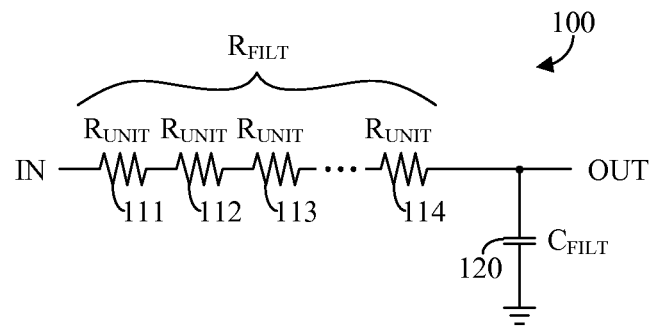
FIG. 1 illustrates generally an existing resistor-capacitor (RC) circuit.
Figure 2:
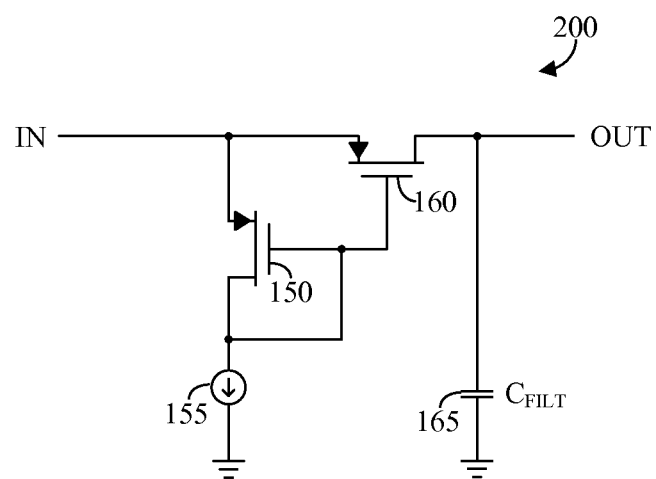
FIG. 2 illustrates generally an existing active resistor solution.

The resistance multiplier system 500 can provide a large resistance value using only a fraction (e.g., 0.1%, 1%, etc.) of the area required by standard high-ohmic poly resistors. In an example, when a capacitor, such as the filter capacitor 120 of FIG. 5, is added to the output of the resistance multiplier system 500, the time constant variation matches with the small time constants implemented in a standard way, such as illustrated in the example of FIG. 1.

In this example, the first and second transistors 135, 145 are illustrated as P-channel, enhancement mode MOSFET devices. In other examples, the first and second transistors 135, 145 can include other devices, and the resistance multiplier 110 can include one or more other devices.

Additional Notes and Examples

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A system comprising:
a resistance multiplier configured to receive a reference resistance value and to provide a resistance between an input and an output a factor higher than the received reference resistance value, the resistance multiplier including:
an amplifier;
a first transistor; and
a second transistor,
wherein the amplifier is configured to control a resistance across the first transistor using the received reference resistance value and a resistance across the second transistor using a relationship between the first and second transistors.

2. The system of claim 1, including a reference resistance coupled to the resistance multiplier.

3. The system of claim 1, including a filter capacitor coupled to the output.

4. The system of claim 1, wherein the amplifier includes first and second inputs and an output, and
wherein the resistance multiplier includes:
a first bias current source, coupled to the first input of the amplifier, configured to provide a first bias current; and
a second bias current source, coupled to the second input of the amplifier, configured to provide a second bias current,
wherein the resistance across the first transistor depends on the received reference resistance value, the first bias current, and the second bias current.

5. The system of claim 4, wherein first input of the amplifier includes negative input and the second input of the amplifier includes a positive input.

6. The system of claim 4, wherein the resistance across the first transistor depends on the received reference resistance value and a ratio of the first bias current to the second bias current.

7. The system of claim 4, wherein the amplifier is configured to drive a gate of the first transistor to establish a resistance across a drain and source of the first transistor to a value greater than the reference resistor value by the inverse of the ratio of the second bias current to the first bias current.

8. The system of claim 4, wherein the first transistor includes a gate coupled to the output of the amplifier, a source coupled to the input of the resistance multiplier, and a drain coupled to the positive input of the amplifier and the second bias current source, and
wherein the second transistor includes a gate coupled to the output of the amplifier, a source coupled to the input if the resistance multiplier, and a drain coupled to the output of the resistance multiplier.

9. The system of claim 1, wherein the relationship between the first and second transistors includes the size of the second transistor with respect to the first transistor.

10. The system of claim 1, wherein the resistance across the second transistor is greater than the resistance across the first transistor by a ratio of an area of the second transistor to an area of the first transistor.

11. The system of claim 1, wherein the resistance across the second transistor is greater than the resistance across the first transistor by a ratio of the width of the second transistor to the width of the first transistor.

12. A method comprising:
receiving a reference resistance value; and
providing, using a resistance multiplier; a resistance between an input and an output of the resistance multiplier a factor higher than the received reference resistance value, including:
controlling; using an amplifier, a resistance across a first transistor using the received reference resistance value; and
controlling, using the amplifier, a resistance across a second transistor using the resistance across the first transistor and a relationship between the first and second transistors.

13. The method of claim 12, wherein the amplifier includes a negative input, a positive input, and an output,
wherein the method includes:
providing a first bias current at the negative input of the amplifier using a first bias current source; and
providing a second bias current at the positive input of the amplifier using a second bias current source, and
wherein the controlling the resistance across the first transistor depends on the received reference resistance value, the first bias current; and the second bias current.

14. The method of claim 13, wherein the controlling the resistance across the first transistor depends on the received reference resistance value and a ratio of the first bias current to the second bias current.

15. The method of claim 13, wherein the first transistor includes a gate coupled to the output of the amplifier, a source coupled to the input of the resistance multiplier, and a drain coupled to the positive input of the amplifier and the second bias current source, and
wherein the second transistor includes a gate coupled to the output of the amplifier, a source coupled to the input if the resistance multiplier, and a drain coupled to the output of the resistance multiplier.

16. The method of claim 12, wherein the amplifier is configured to control the resistance across the second transistor using a ratio of an area of the first transistor to an area of the second transistor.

17. A system comprising:
a reference resistance; and
a resistance multiplier, coupled to the reference resistance, configured to provide a resistance between an input and an output a factor greater than the value of the reference resistor, the resistance multiplier including:
an amplifier including first and second inputs and an output;
a first bias current source, coupled to the first input of the amplifier, configured to provide a first bias current;
a second bias current source, coupled to the second input of the amplifier, configured to provide a second bias current;
a first transistor including a gate, a drain, and a source; and
a second transistor including a gate, a drain; and a source,
wherein the amplifier is configured to drive a gate of the first transistor to establish a resistance across the drain and source of the first transistor to a value greater than the reference resistor value by a ratio of the first bias current to the second bias current, and
wherein the amplifier is configured to drive a gate of the second transistor to establish a resistance across the drain and source of the second transistor to a value greater than the resistance across the first transistor by a ratio of the size of the second transistor to the first transistor.

18. The system of claim 17, including a filter capacitor coupled to the output.

19. The system of claim 17, wherein first input of the amplifier includes negative input and the second input of the amplifier includes a positive input.

20. The system of claim 17, wherein the gate of the first transistor is coupled to the output of the amplifier, the source of the first transistor is coupled to the input of the resistance multiplier, and the drain of the first transistor is coupled to the positive input of the amplifier and the second bias current source, and
wherein the gate of the second transistor is coupled to the output of the amplifier, the source of the second transistor is coupled to the input if the resistance multiplier, and the drain of the second transistor is coupled to the output of the resistance multiplier.

* * * * *